US010443791B2

(12) United States Patent
Wimmer et al.

(10) Patent No.: US 10,443,791 B2
(45) Date of Patent: Oct. 15, 2019

(54) LED MODULE HAVING PLANAR SECTORS FOR EMITTING DIFFERENT LIGHT SPECTRA

(71) Applicant: TRIDONIC JENNERSDORF GMBH, Jennersdorf (AT)

(72) Inventors: Florian Wimmer, Jennersdorf (AT); Jurgen Gumhold, Jennersdorf (AT)

(73) Assignee: TRIDONIC JENNERSDORF GMBH, Jennersdorf (AT)

( * ) Notice: Subject to any disclaimer, the term of this patent is extended or adjusted under 35 U.S.C. 154(b) by 218 days.

(21) Appl. No.: 15/128,733

(22) PCT Filed: Mar. 17, 2015

(86) PCT No.: PCT/EP2015/055526
§ 371 (c)(1),
(2) Date: Sep. 23, 2016

(87) PCT Pub. No.: WO2015/144492
PCT Pub. Date: Oct. 1, 2015

(65) Prior Publication Data
US 2017/0122504 A1    May 4, 2017

(30) Foreign Application Priority Data

Mar. 27, 2014  (DE) .................. 20 2014 101 449 U
Jul. 2, 2014    (DE) .................. 20 2014 103 033 U (51) Int. Cl.
*F21K 9/64*     (2016.01)
*F21V 9/30*     (2018.01)
(Continued)

(52) U.S. Cl.
CPC ............... *F21K 9/64* (2016.08); *F21K 9/00* (2013.01); *F21K 9/62* (2016.08); *F21V 3/00* (2013.01); *F21V 7/22* (2013.01); *H01L 25/0753* (2013.01); *H01L 33/507* (2013.01); *H01L 33/56* (2013.01); *F21V 9/30* (2018.02); *F21Y 2105/12* (2016.08); *F21Y 2105/18* (2016.08); *F21Y 2113/13* (2016.08); *F21Y 2115/10* (2016.08); *H01L 2924/0002* (2013.01)

(58) Field of Classification Search
CPC ..... F21K 9/64; F21V 9/30; F21V 9/32; F21V 9/38; F21V 23/003; H01L 33/50–505; H01L 2933/0041; H01L 25/0753; H01L 2224/48137
See application file for complete search history.

(56) References Cited

U.S. PATENT DOCUMENTS 8,835,931 B2    9/2014  Wirth
10,153,408 B2*  12/2018  Abe .................. H01L 25/0753
(Continued)

FOREIGN PATENT DOCUMENTS

DE    102010027875 A1    10/2011
JP       2013118198 A     6/2013
WO      2013015058 A1     1/2013

*Primary Examiner* — Suezu Ellis
(74) *Attorney, Agent, or Firm* — Volpe and Koenig, P.C.

(57) ABSTRACT

The invention relates to an LED-module (1) for emitting mixed light, preferably white light, comprising a light field (2''';2'''') which is divided into several flat sectors for dispensing different light spectra. The flat sectors of the light field (2''';2'''') are embodied as sectors of a circle (3c''', 3d''';3c'''',3d'''') and sectors of a circular ring (3a''',3''';3a'''', 3b'''').

25 Claims, 7 Drawing Sheets

(51) Int. Cl.
*H01L 33/50* (2010.01)
*H01L 33/56* (2010.01)
*F21K 9/62* (2016.01)
*F21K 9/00* (2016.01)
*H01L 25/075* (2006.01)
*F21V 3/00* (2015.01)
*F21V 7/22* (2018.01)
*F21Y 105/12* (2016.01)
*F21Y 115/10* (2016.01)
*F21Y 113/13* (2016.01)
*F21Y 105/18* (2016.01)

(56) References Cited

U.S. PATENT DOCUMENTS

| | | | |
|---|---|---|---|
| 2008/0252197 A1* | 10/2008 | Li | H05B 33/0818 313/502 |
| 2010/0025700 A1* | 2/2010 | Jung | H01L 25/0753 257/89 |
| 2010/0172120 A1* | 7/2010 | Wegh | F21S 10/02 362/84 |
| 2011/0278605 A1* | 11/2011 | Agatani | H01L 25/0753 257/89 |
| 2012/0224364 A1 | 9/2012 | Mizuta et al. | |
| 2012/0300452 A1 | 11/2012 | Harbers et al. | |
| 2013/0088852 A1* | 4/2013 | Kamee | F21V 9/30 362/84 |
| 2013/0141013 A1 | 6/2013 | Kodama et al. | |
| 2013/0229785 A1* | 9/2013 | Harbers | F21V 7/0008 362/84 |
| 2013/0264947 A1* | 10/2013 | Ouderkirk | H01L 25/0753 315/151 |
| 2014/0197431 A1 | 7/2014 | Oka | |
| 2014/0340890 A1* | 11/2014 | Hata | A01G 7/045 362/231 |
| 2014/0367710 A1* | 12/2014 | Akiyama | H05B 33/0803 257/88 |

* cited by examiner

LED MODULE HAVING PLANAR SECTORS FOR EMITTING DIFFERENT LIGHT SPECTRA

FIELD OF THE INVENTION

The present invention relates to an LED module (light-emitting diode module) for emitting mixed light, preferably white light. In particular, the present invention relates to an LED module that is suitable for lamps with small reflector sizes. The present invention finally likewise relates to a lamp device with such an LED module.

BACKGROUND

The prior art discloses LED modules that are suitable for emitting white light. These LED modules generally have a light-emitting light zone, which is formed by a combination of individual points of light. The individual points of light are designed to emit different light spectra. For example, blue light, red light and a phosphor-produced yellow light are emitted by the points of light.

Figure 1A:
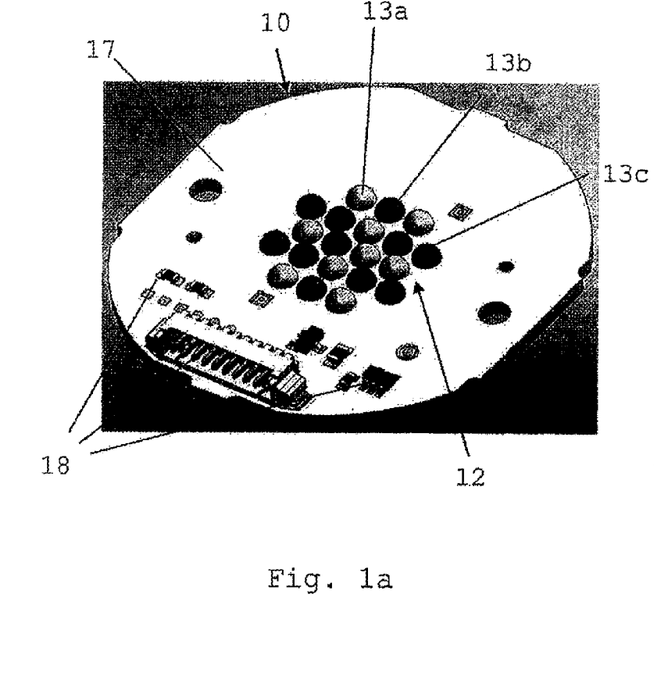
FIGS. 1a and 1b show an LED module that is known from the prior art.
Figure 1B:
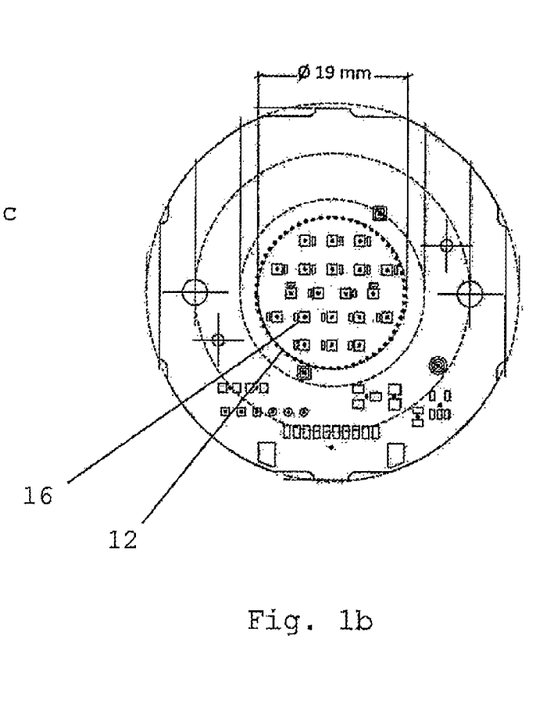

Such a known LED module 10 is shown for example in FIG. 1a. FIG. 1b shows a plan view of the same LED module 10. The LED module 10 has a light zone 12, which is arranged together with further components 18 on a module plate 17. The light zone 12 is formed by multiple points of light 13a, 13b, 13c, which respectively emit light from a different wavelength range, i.e. a different light spectrum. As shown in FIG. 1b, each of the points of light 13a, 13b, 13c is assigned at least one LED 16. The points of light 13a, 13b, 13c are generally formed by so-called glob tops (dispensed drops) over the LEDs 16.

The known LED module 10 has the disadvantage that it has too large a light zone 12 to allow it to be fitted in lamps with small reflector sizes. A light zone 12 shown in FIG. 1b has in practice a diameter of at least 19 mm, it not being possible in principle to reduce the diameter of the light zone 12 any further with the glob top method (by a dispensing method).

In the light of this prior art, one of the objects of the present invention is to provide an LED module for emitting mixed light, preferably a (mixed) white light, that improves the known prior art. In particular, it is intended to provide an LED module with which a particularly homogeneous mixed light can be produced. Another object of the present invention is to provide an LED module that is suitable for lamps with small reflector sizes.

These and other objects that are still to be mentioned in the course of reading the following description or can be identified by a person skilled in the art are achieved by the subject matter of the independent claims. The dependent claims develop the central concept of the present invention in a particularly advantageous way.

SUMMARY

According to the present invention, an LED module for emitting mixed light is provided, comprising: a light zone, which is divided into multiple flat or planar sectors for emitting different light spectra, the planar sectors of the light zone being formed as sectors of a circle and sectors of a circular ring.

For the purposes of the present invention, a planar sector is to be taken as meaning generally a contiguous area, which is preferably separated from the other (adjacent) planar sectors by dams/dividing walls.

A light zone is the term used for a light-emitting area of the LED module according to the invention. Dividing the light zone into planar sectors makes it possible to significantly reduce the overall area of the light zone in comparison with the overall area of a known LED module that contains points of light defined by glob tops. The arrangement in sectors allows the overall light-emitting area of the light zone to be reduced in size in particular by at least about 16%. Such a reduction is not possible in principle with the glob top approach known from the prior art. The significant reduction in area of the light zone means that the LED module according to the invention is also suitable for lamps with small reflector sizes (for example as a so-called spot module).

Advantageously, at least two planar sectors are provided for each light spectrum.

The LED module according to the invention is preferably designed to emit two different light spectra. In each case, a light spectrum is preferably coupled out from at least two of the planar sectors of the light zone. As a result, a very homogeneous and true-color mixed light can be produced overall by the LED module, in particular a white light (with a high CRI).

The light spectrum of each sector is preferably white, but differs by the color temperature. For this purpose, there may for example be the same (for example blue) LED chips in each sector, but different color conversion substances and/or different concentrations of color conversion substances are used.

Advantageously, the outer contour of the light zone is circular. The circular form is of advantage in particular for lamps that have optics with a placed-on reflector.

Both the sectors of a circle and the sectors of a circular ring are to be regarded here as planar sectors. This advantageous arrangement of the planar sectors in the light zone makes it possible for example to form an LED module that emits mixed light from at least two different light spectra and at the same time has a particularly small overall light-emitting area. The light zone can therefore be reduced in area. In addition, the proposed forming of the light area allows a particularly homogeneous mixed light to be produced, since the respective light emissions particularly advantageously "intermix".

The planar sectors may be designed to emit red light, blue light and light from a further light spectrum, which is preferably produced by a phosphor. This further light spectrum may for example be light from the green and/or yellow light spectrum.

The planar sectors may for example emit white light with different color temperatures, for example so-called cold-white and/or warm-white spectra.

The different light spectra are particularly preferably provided by applying to LED chips/strings of LEDs, which are preferably identically constructed and preferably provide a blue light spectrum, a potting compound with different phosphor concentrations and/or phosphors or phosphor combinations (i.e. there is preferably no so-called remote phosphor, but instead the potting compounds are applied directly to the LED chips). The potting compound is preferably a silicone- and/or epoxy-based potting compound.

The potting compound may additionally comprise diffusing particles.

Advantageously, the light zone has a diameter of 16 mm or less. This significantly reduced light zone diameter in comparison with the prior art means that the LED module according to the invention is suitable for converting a lamp with small reflector sizes.

Advantageously, the LED module also has a light-diffusing screen, which is arranged at a distance from the light zone in the light-emitting direction of the light zone.

The light-diffusing screen imparts to the LED module a still more homogeneous color impression, i.e. the diffusion of the light has the effect that the mixing of the different light spectra that are emitted by the light zone is further improved. The light-diffusing screen also makes it possible to produce a diffuse light and to set the brightness of the LED module. The light-diffusing screen may additionally be provided with a phosphor, for example with an additional phosphor layer or embedded phosphor particles. The diffusing screen is then suitable for influencing the color or color temperature of the light that is emitted overall by the LED module.

Advantageously, the diffusing screen is separated from the upper side of the light zone by a mixing chamber. The mixing chamber preferably provides particularly effective mixing of the various light spectra that are emitted by the planar sectors of the light zone. For an observer of the LED module, a very homogeneous mixed light is then visible. The individual planar sectors of the light zone and the various light spectra emitted by them preferably cannot be seen from the outside by an observer.

Advantageously, the light zone with the planar sectors is produced by a dispensing method in which the potting compound with the color conversion substance is dispensed after a prefabricated or cured-in-situ dam has been applied. This method, also referred to as a "dam-and-fill" method, allows the planar sectors of the light zone to be produced particularly easily. The method makes a significantly smaller light zone possible and can be achieved by the known method, in which the glob tops are applied directly on the individual LED chips. The planar sectors may be a ready-made component that is mounted on a module plate of the LED module.

Advantageously, the planar sectors of the light zone are separated from one another by dams or dividing walls. The dams may either be formed directly on the carrier material by a suitable material being applied and cured (by a so-called dispensing method) or be produced initially as a separate component that is subsequently connected to the carrier material. The dams preferably have a width which, when seen in plan view, is between 50 µm and 2 mm, particularly preferably between 100 µm and 1 mm and more preferably between 300 µm and 800 µm.

Advantageously, the planar sectors of the light zone comprise a transparent potting compound or a potting compound containing a phosphor (for example a phosphor loading, it being possible for the respective planar sectors to be formed with different phosphor loadings, so that different light spectra can be provided).

In the LED module according to the invention, the individual sectors of the light zone are preferably defined by the delimiting dams and the intermediate spaces between the dams are filled with a potting compound, in order to make the sectors planar. As stated, the potting compound may consist of a transparent potting compound with added phosphor, which for example takes the form of phosphor particles dispersed therein. The potting compound may also contain dissolved phosphors, i.e. it may be a phosphor potting compound.

A phosphor (also referred to as a color-conversion substance) is generally a substance that can be excited by light and then emits a secondary light spectrum. A phosphor may therefore be a light color-conversion substance. For example, the phosphor is an inorganic material or a Q dot (for example ZnS, ZnSe, CdS, CdSe, ZnTe, CdTe). Secondary light from the yellow, green and/or red spectral range is preferably emitted by the phosphor.

Phosphors that can be used are known from the prior art, for example silicates ($Ca_3Sc_2Si_3O_{12}:Ce^{3+}$), orthosilicates (BOSE), garnets (YAG:$Ce^{3+}$, (YGd)AG:$Ce^{3+}$, LuAG:$Ce^{3+}$), oxides ($CaScO_2:Eu^{2+}$), SiALONs ($\square$-SiALON:$Eu^{2+}$, $\square$-SiALON:$Eu^{2+}$), nitrides ($La_3Si_6N_{11}:Ce^{3+}$, $CaAlSiN_3:Ce^{3+}$), oxynitrides ($SrSi_2N_2O_2:Eu^{2+}$, $(Ca,Sr,Ba)Si_2N_2O_2:Eu^{2+}$).

The present invention understands light from the red light spectrum as meaning light with a peak wavelength of between approximately 580 and 670 nm, light from the blue light spectrum as meaning light with a peak wavelength of between approximately 390 and 480 nm, light from the green light spectrum as meaning light with a peak wavelength of between approximately 480 and 560 nm and light from the yellow light spectrum as meaning light with a peak wavelength of between 560 and 630 nm.

As a result, the LED module according to the invention is suitable for emitting white light, in particular white light with a natural effect. White light with a natural effect preferably has a light color temperature that corresponds to that of a black-body radiator.

Advantageously, the planar sectors are respectively provided with at least one LED or at least one string of LEDs. It is also preferred that each sector of a circle or each sector of a circular ring has the same number of (for example blue) LEDs (for example strings of LEDs of the same construction may be used in the sectors of a circle or in the sectors of a circular ring). The strings of LEDs can preferably be driven separately or in interconnected groups (depending on the number of strings of LEDs used). In this case, the strings of LEDs that are intended for emitting a first light spectrum and the strings of LEDs that are intended for emitting a second light spectrum may for example be respectively interconnected in groups. As a result, any desired mixed light in the range between the first light spectrum and the second light spectrum can be set and emitted.

The at least one LED or the at least one string of LEDs (i.e. multiple interconnected LEDs) is preferably situated between the dams of the individual sectors on a module plate (or carrier plate) of the LED module. The LEDs or the string of LEDs is/are preferably potted with the potting compound. As a result, the LEDs or the string of LEDs is/are fixed and protected. The light emitted by the LED or the string of LEDs is transported out of the LED module by the potting compound, and possibly thereby influenced or converted by a phosphor in the potting compound. The LEDs may for example be LEDs that give off blue light, red light, green light, yellow (amber) light or UV light. The light spectrum emitted by a planar sector may be created by an interaction between at least one LED and the potting compound, or be produced directly by the at least one LED. The planar sectors may emit red, green, yellow, green-yellow or white light with different shades of white. These light colors may be produced by the monochromatic LEDs used and/or by the phosphor(s) used.

The present invention also relates to an LED module produced by a method which comprises the following steps: producing a light zone which is divided into planar sectors, the planar sectors of the light zone being formed as sectors of a circle and sectors of a circular ring, by forming dams which separate sectors of the light zone from one another, and filling in between the dams of each sector a transparent potting compound or a potting compound containing a phosphor.

The present invention also relates to a lamp device which has at least one LED module as described above and preferably a reflector placed onto the LED module.

BRIEF DESCRIPTION OF THE DRAWINGS

The present invention is now described in still more detail with reference to the appended drawings.

DETAILED DESCRIPTION OF THE PREFERRED EMBODIMENTS

Figure 2A:
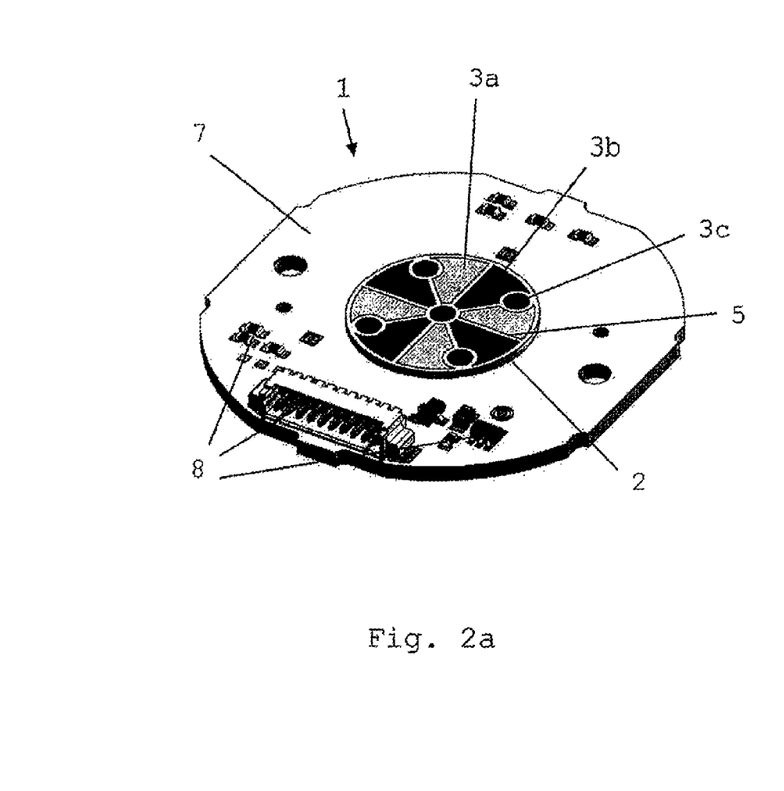
FIGS. 2a and 2b show an LED module with a first embodiment of a light zone.

FIG. 2a shows a three-dimensional lateral view of an LED module 1 with a first embodiment of a light zone 2. The LED module 1 is suitable for emitting mixed light, for example for emitting white light. For this purpose, various emitting light spectra are mixed in the LED module 1 in such a way that the mixed light or the white light of the LED module 1 is produced as an overall impression for an observer.

The LED module 1 has a module plate 7, arranged on which is at least one light zone 2, which is designed for emitting the light of the LED module 1. The light zone 2 emits the light from its planar surface. Still further components 8 are also advantageously arranged on the module plate 7. These further components 8 may for example be electronic components, such as driving components, microprocessors, capacitances, inductances, resistors, electrical leads or the like. The electronic components may power and/or control LEDs 6 or strings of LEDs of the LED module 1. The further components 8 may also include cooling elements for dissipating heat from the module plate 7 or the light zone 2. Furthermore, the module plate 7 may be provided with attachment means for attaching the LED module 1, for example in a lamp housing. As shown in FIG. 1a, the module plate 7 has for example holes for screwing on the LED module 1. The module plate 7 may for example be a conductor plate such as a printed circuit board (PCB). The module plate 7 is advantageously formed at least partially from a material that is suitable for heat dissipation.

The light zone 2 of the LED module 1 is divided into multiple planar sectors 3a, 3b, 3c (here sectors of a circle and circular areas). Each of the sectors 3a, 3b, 3c is designed for emitting light from a specific light spectrum. The light zone 2 preferably comprises at least a first type of sectors 3a (here sectors of a circle), which emit light from a first light spectrum, and a second type of sectors 3b (here sectors of a circle), which emit light from a second light spectrum. The light zone 2 preferably also comprises a third type of sectors 3c (here circular areas), which emit light from a third light spectrum. It is of course also possible to use more different types of sectors, which altogether emit four or even more different light spectra.

For each emitted light spectrum, the light zone 2 preferably comprises at least two sectors 3a, 3b, 3c. In order to produce white light with a predetermined color temperature and/or color rendition (CRI: Color Rendering Index) as the mixed light, the light zone 2 may for example comprise a first type of sectors 3a, which emit white light that is preferably produced by a blue LED and a phosphor incorporated in the potting compound, comprise a second type of sectors 3b, which emit blue light (preferably emitted by the monochromatic blue LEDs), and comprise a third type of sectors 3c, which emit light from a further light spectrum. This further light spectrum advantageously comprises the blue light spectrum. It is conceivable that sectors 3b present white light with a different color temperature/emission spectrum in comparison with sectors 3a.

The fact that in the LED module 2 according to the invention the various regions of the light zone 2 that emit different light spectra are not formed by points of light but by planar sectors 3a, 3b, 3c means that a reduction in the size of the overall area of the light zone 2 is possible. The overall light-emitting area of the LED module 1 can thus be reduced.

Figure 2B:
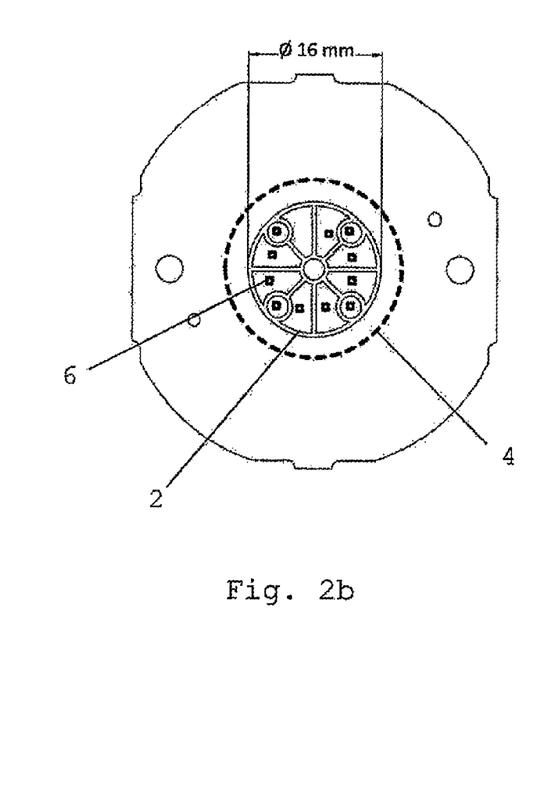

As shown in FIGS. 2a and 2b, the light zone 2 is preferably round. In particular, the light zone 2 most preferably has a circular outer contour, but may also be oval, elliptical or the like. The diameter of the light zone 2 is preferably 16 mm or less. The area of the light zone 2 may be approximately 200 mm2 or less and is reduced in size in comparison with the prior art by 16%. As shown in FIG. 2a, the circular light zone 2 preferably has a division into different types of sectors of a circle 3a and 3b.

The light zone 2 that is shown in FIGS. 2a and 2b also has multiple circular islands 3c, which are arranged within the outer contour of the light zone 2. For example, as shown in FIG. 2a, one circular island 3c may form the middle of the light zone 2, i.e. for example form the center point of the circular outer contour.

In addition, further circular islands 3c may for example be arranged at regular intervals along the circumference of the light zone 2.

The circular islands 3c are preferably intended for emitting light from the red spectrum. The actual sectors of a circle 3a and 3b are preferably intended for emitting light from the blue light spectrum and/or a further light spectrum, which is for example produced by a phosphor. By selecting the diameters of the circular islands 3c and/or the areas of the sectors of a circle 3a and 3b during the production process of the LED module 1, the color of the LED module 1 or its color temperature can be determined.

The planar sectors 3a, 3b, 3c of the light zone 2 are preferably formed by damming and filling. For this purpose, in a first step dams 5, which determine the later structure of the sectors 3a, 3b, 3c, are formed on the module plate 7 of the LED module. The outer contour of the light zone 2 is thereby formed by a dam 5. For dividing sectors 3a, 3b, 3c, straight or curved dams 5 for example are drawn within the outer contour of the light zone 2. For forming circular islands, circular dams 5 may be formed within the outer contour of the light zone 2.

As soon as the dams 5 are formed on the module plate 7, the intermediate spaces thereby determined are filled. The filling is performed either with a transparent potting compound or with a potting compound that is provided with a phosphor, for example with phosphor particles. Phosphor particles may be provided in the potting compound as powdered phosphor. The potting compound itself may also have light-converting properties. A phosphor is generally distinguished by the fact that it can be excited by light of an LED 6 and then emits a secondary light spectrum. The dams 5 may either be formed directly on the module plate 7 (the carrier material) by a suitable material being applied and cured or be produced initially as a separate component that is subsequently connected to the module plate 7. The dams 5 preferably have a width which, when seen in plan view, is between 50 µm and 2 mm, particularly preferably between 100 µand 1 mm and more preferably between 300 µm and 800 µm.

Before the filling step, at least one LED 6 or a string of LEDs is preferably arranged in each planar sector 3a, 3b, 3c. Strings of LEDs with an identical number of LEDs are preferably arranged in the planar sectors 3a, 3b that are formed as sectors of a circle. The LEDs or strings of LEDs may however also have already been embedded in advance in the module plate 7 and the sectors 3a, 3b, 3c are consequently formed over the LEDs 6. The dams 5 may also be formed around LEDs 6 or strings of LEDs arranged on the module plate 7. The LEDs 6 or strings of LEDs are preferably enclosed by the potting compound that is filled between the dams 6. The LEDs 6 or strings of LEDs are supplied with power and can be driven, preferably separately or in groups, by way of the module plate 7.

Those sectors 3a, 3b, 3c that are filled with a transparent potting compound are designed to emit light emitted by one or more LEDs 6 in an unchanged form. For example, red and/or blue light from an LED 6 giving off red light and/or blue light may be emitted by such sectors 3a, 3b, 3c. On the other hand, those sectors 3a, 3b, 3c that are filled with a potting compound containing a phosphor are designed to emit light emitted by one or more LEDs 6 in a changed form. This takes place for example by the light of these LEDs 6 exciting the phosphor in the potting compound, whereby a secondary light spectrum is emitted by the phosphor. For example, yellow, green or red light may in this way be produced and emitted.

In the light zone 2 of the LED module 1, each planar sector 3a, 3b, 3c may be provided with a potting compound which can change the light of the enclosed LEDs 6, or else only some of the sectors 3a, 3b, 3c. It is even possible that each individual sector 3a, 3b, 3c of the light zone 2 is itself designed to produce a white light. For example, for this purpose an LED 6 giving off blue light may be used in each sector 3a, 3b, 3c, and a different phosphor potting compound may be used as the filling for each sector. As a result, a white light is produced by a combination of three different white lights, for example, and a particularly natural color temperature can be achieved, for example with a high color rendition (CRI).

The LEDs 6 or strings of LEDs in the various sectors 3a, 3b, 3c of the light zone 2 may be individually or jointly drivable in such a way that their luminescent color can be varied by the driving. Furthermore, each LED 6 or each string of LEDs can preferably be dimmed individually, for example by means of pulse width modulation.

FIG. 2b shows a plan view of the LED module 1. As shown, a diffusing screen 4, which is represented here as a dashed circle, may be arranged in front of the light-emitting area of the light zone 2. The diffusing screen 4 has at least the same diameter as the light zone 2, preferably a greater diameter. The diffusing screen 4 may be provided with diffusing particles, which are chosen in such a way that they diffuse light emitted by the light zone 2. For this purpose, the diffusing particles have a grain size that corresponds approximately to the wavelength of the emitted light spectra.

The diffusing screen 4 is preferably arranged at a distance from the upper side of the light zone 2.

Between the upper side of the light zone 2 and the diffusing screen 4 there is preferably a so-called mixing chamber. In the simplest case, the mixing chamber is merely a free space between the light zone 2 and the diffusing screen 4. However, the mixing chamber is preferably designed to achieve an effective intermixing of the various light spectra that are emitted by the light zone 2. For this purpose, optical elements may for example be provided in the mixing chamber. Optical elements are for example lenses or reflectors. The mixing chamber may however also be a solid block of a material that has a high refractive index, for example of 1.5 or more. Altogether, the mixing chamber and the diffusing screen 4 together achieve the effect that the individual light spectra that are emitted by the various planar sectors 3a, 3b, 3c of the light zone 2 are no longer distinguishable by an observer of the LED module 1, but appear as homogeneous mixed light, preferably homogeneous white light.

Figure 3:
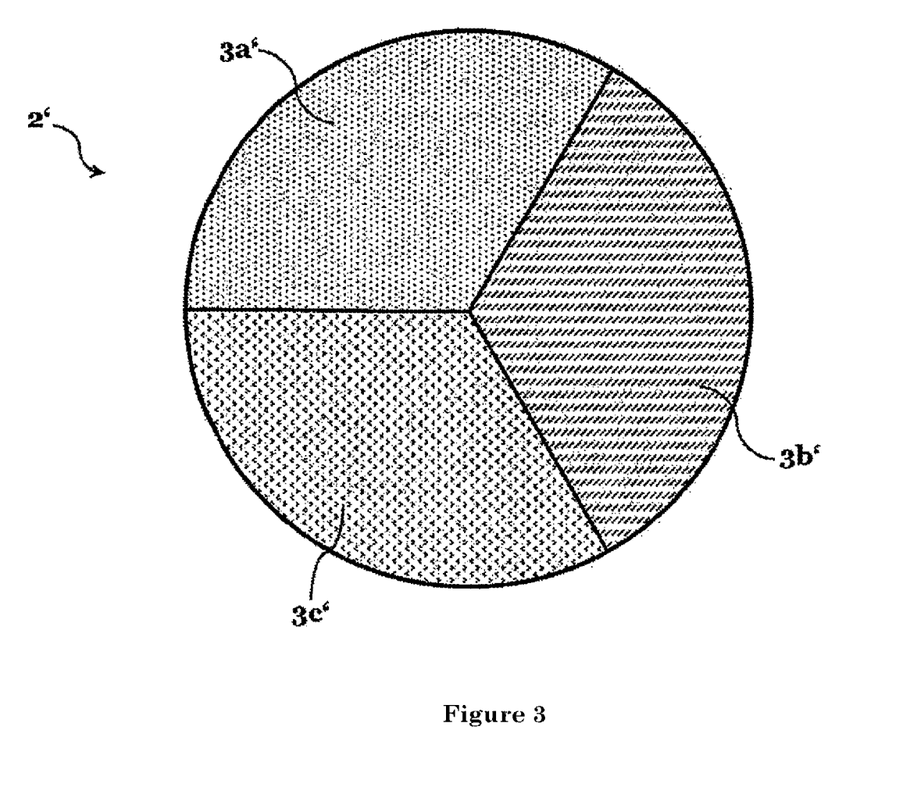
FIG. 3 shows a second embodiment of a light zone for an LED module.

FIG. 3 shows a second configuration of a light zone 2' for an LED module. As a difference from the light zone 2 that is shown in FIGS. 2a and 2b, the light zone 2' does not comprise any circular islands 3c, but in each case only a sector of a circle 3a', 3b' and 3c' for emitting light from a specific light spectrum. The light zone 2' comprises a first sector 3a, which can emit light from a first light spectrum, a second sector 3b, which can emit light from a second light spectrum, and a third sector 3c, which can emit light from a third light spectrum.

Figure 4:
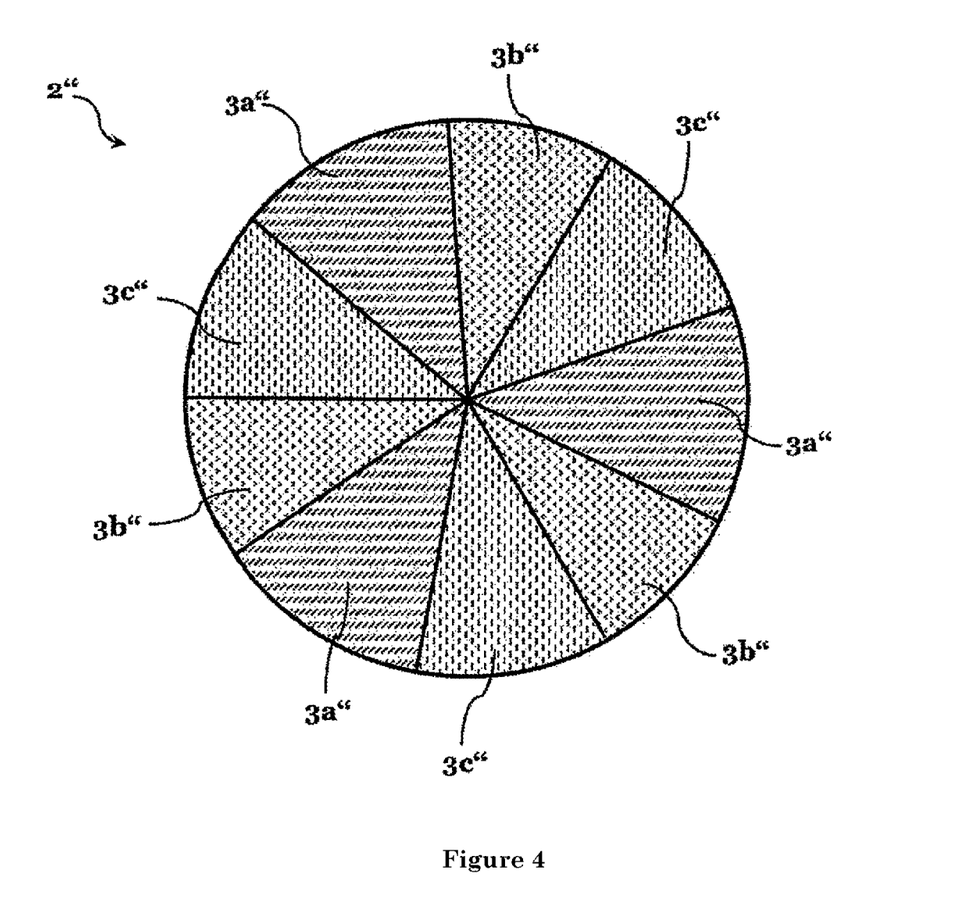
FIG. 4 shows a third embodiment of a light zone for an LED module.

FIG. 4 shows a third configuration of a light zone 2" for an LED module. The light zone 2" in turn does not comprise any circular islands 3c, but in each case various sectors 3a", 3b" and 3c". The light zone 2" comprises a first type of sectors 3a, which can emit light from a first light spectrum, a second type of sectors 3b, which can emit light from a second light spectrum, and a third type of sectors 3c, which can emit light from a third light spectrum.

Figure 5:
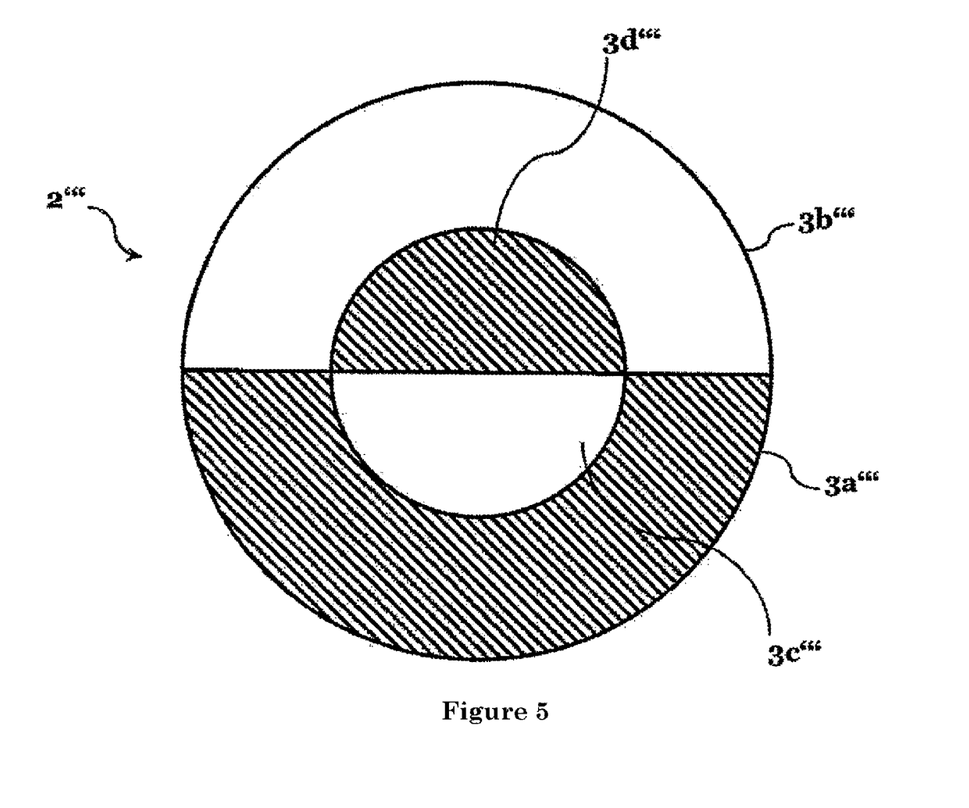
FIG. 5 shows a fourth embodiment of a light zone for an LED module according to the present invention.

FIG. 5 shows a fourth configuration of a light zone 2''' for an LED module 1 according to the present invention.

As a difference from the configurations explained above of the light zone, the light zone 2''' has, as planar sectors, sectors of a circle 3c''', 3d''' (semicircles in the embodiment shown) and sectors of a circular ring 3a''', 3b'''. A sector of a circle 3d''' and a sector of a circular ring 3a''' are formed in such a way as to be able to emit a first light spectrum and a sector of a circle 3cm and a sector of a circular ring 3b''' are formed in such a way as to be able to emit a second light spectrum. For clarification, the planar segments 3a''', 3d''' for emitting the first light spectrum are provided with a hatching, the planar segments 3b''', 3c''' for emitting the second light spectrum have no hatching. As a result, a mixed light (preferably a white light) can be produced by the two light spectra, a light spectrum being respectively produced by two planar sectors.

Figure 6:
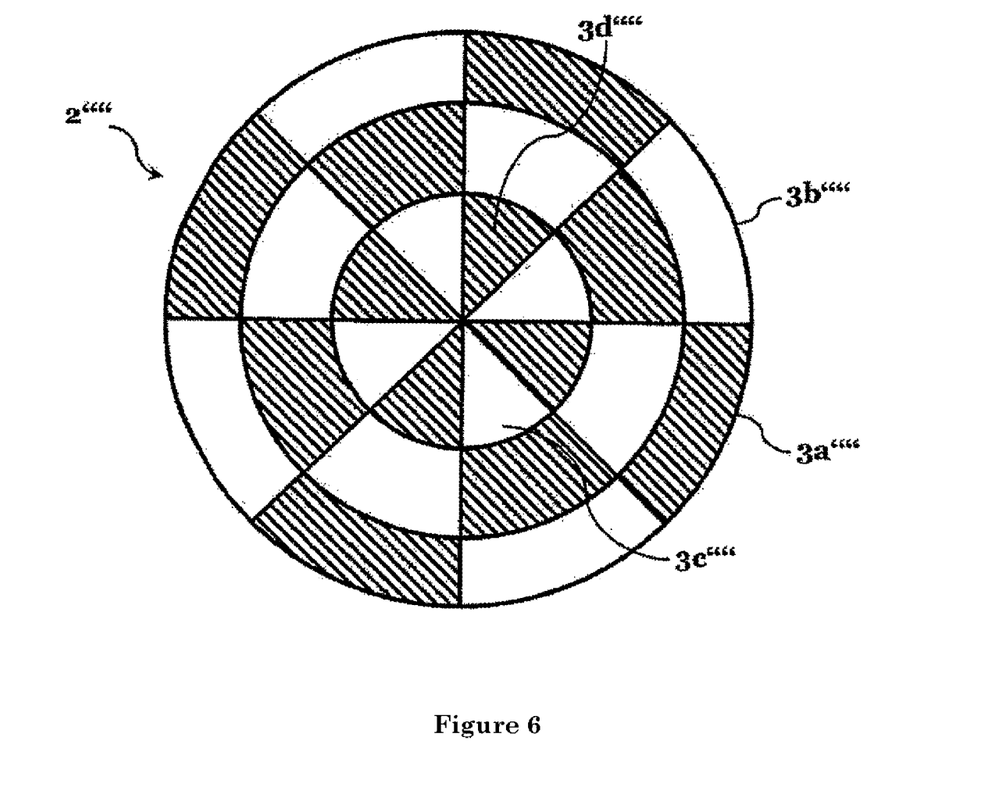
FIG. 6 shows a fifth embodiment of a light zone for an LED module according to the present invention.

FIG. 6 shows a fifth preferred embodiment of a light zone 2"" for an LED module 1 according to the present invention, which is particularly preferably suitable for emitting a very homogeneous (white) light. As shown in FIG. 6, the light zone 2"" has in comparison with the light zone 2"" a greater number of sectors of a circle 3c"", 3d"" and sectors of a circular ring 3a"", 3b"", the basic principle however being the same.

A mixed light from a first light spectrum (provided by the sectors of a circle 3d"" and sectors of a circular ring 3a"" provided with hatching) and a second light spectrum (provided by the sectors of a circle 3c"" and sectors of a circular ring 3b"" without hatching) can be provided by the light zone 2''''. As can be seen in FIG. 6, the planar sectors are arranged in a way comparable to the areas on a dartboard. The proposed division of the planar sectors therefore allows particularly intense "intermixing" of the respectively emitted light to be provided, and consequently a particularly homogeneous mixed light/white light.

Figure 7:
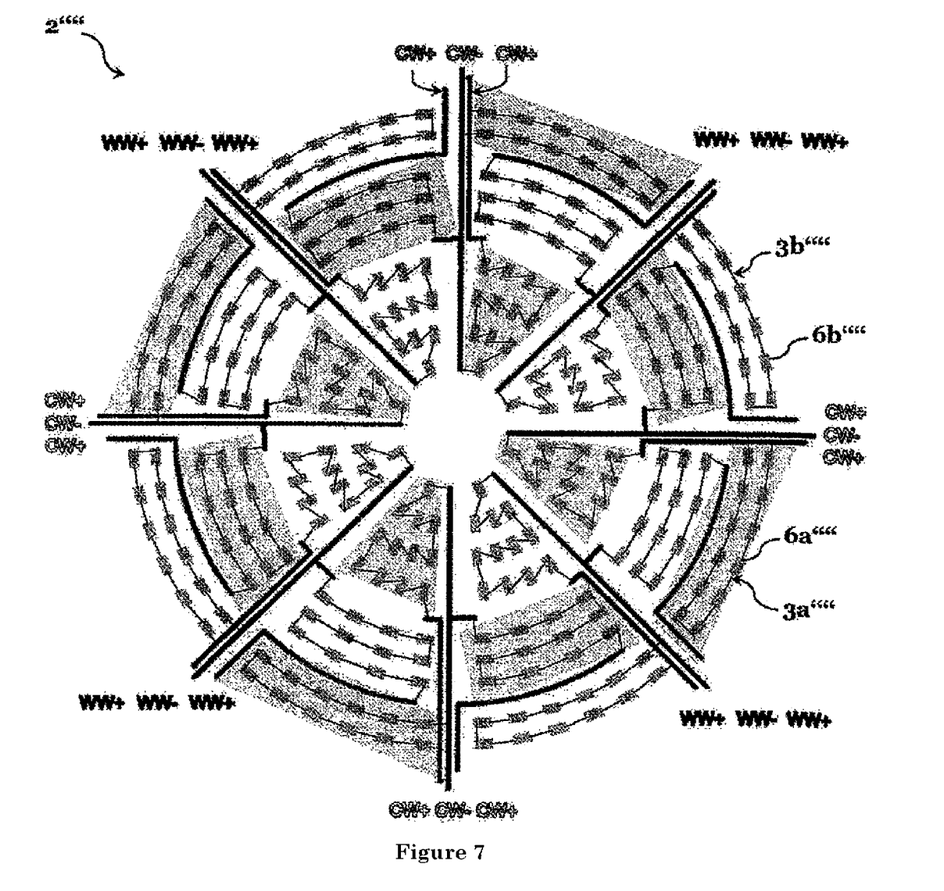
FIG. 7 shows a preferred arrangement and interconnection of the strings of LEDs of the light zone shown in FIG. 6.

FIG. 7 shows a preferred arrangement and interconnection of respective strings of LEDs 6a'''', 6b'''', which are preferably used in the planar sectors 3a'''', 3b'''', 3c'''', 3d'''' of the light zone 2'''' shown in FIG. 6. The strings of LEDs 6a'''', 6b'''' are preferably fitted with blue LEDs.

As explained above, it is possible to apply to the respective strings of LEDs 6a'''', 6b'''' a corresponding potting compound (for example a silicone-based potting compound), which is formed as transparent or with a phosphor loading. For example, the planar sectors for producing the first light spectrum (i.e. the sectors of a circle 3d'''' and sectors of a circular ring 3a'''') may be covered with a potting compound that has a phosphor loading. By contrast, the planar sectors for providing the second light spectrum (i.e. the sectors of a circle 3c'''' and sectors of a circular ring 3b'''') are covered with a transparent potting compound.

As can likewise be seen in FIG. 7, preferably arranged in the planar sectors 3a'''', 3b'''', 3c'''', 3d'''' are strings of LEDs 6a'''', 6b'''' with an identical number of LEDs (here for example strings of LEDs with 12 blue LEDs).

In the preferred embodiment shown, the sectors of a circle 3d'''' and sectors of a circular ring 3a'''' for producing the first light spectrum are interconnected with one another (in FIG. 7 the respective voltage potentials for the strings of LEDs 6a'''' being identified by "CW+" and "CW−" and the respective voltage potentials for the strings of LEDs 6b'''' being identified by "WW+" and "WW−") and can be driven together. As can be seen, the voltage-carrying lines are preferably led in the transitional region between respective planar sectors. Alternatively, it is also possible to lead voltage-carrying lines to each individual planar sector, so that the planar sectors can each be individually driven.

The present invention is not restricted to the exemplary embodiments given above, as long as it is covered by the subject matter of the following claims Furthermore, the exemplary embodiments given above can be combined in any way desired with one another and among one another. In particular, all of the light zones described above can be used in an LED module described above, so that, unless differences have explicitly been highlighted, the respective explanations with regard to the LED module or the respective light zones apply in principle to all light zones.

What is claimed is:

1. A light emitting diode (LED) module (1) for emitting mixed light comprising:
   a light zone (2'''; 2''''), which is divided into multiple planar sectors for emitting different light spectra, and
   a light-diffusing screen (4), which is arranged at a distance from the light zone (2'''; 2'''') in the light-emitting direction of the light zone (2'''; 2''''), wherein the planar sectors of the light zone (2''') are formed as sectors of a circle (3c''', 3d'''; 3c'''', 3d'''') and sectors of a circular ring (3a''', 3b'''; 3a'''', 3b''''),
   the planar sectors of the light zone (2''') each include an individual voltage-carrying line such that the planar sectors of the light zone (2''') are individually driven,
   wherein the planar sectors of the light zone (2''') include strings of LEDs, and the string of LEDs have varying voltage potentials,
   each voltage-carrying line is positioned in a transitional region between adjacent planar sectors of the planar sectors of the light zone (2'''), and
   each voltage-carrying line extends in a radial direction to separate adjacent sectors of the circular ring (3a''', 3b'''; 3a'''', 3b'''').

2. The LED module (1) as claimed in claim 1, wherein at least two planar sectors (3a''', 3a'''', 3b''', 3b'''', 3c''', 3c'''', 3d''', 3d'''') are provided for each light spectrum.

3. The LED module (1) as claimed in claim 1, wherein an outer contour of the light zone (2'''; 2'''') is circular.

4. The LED module (1) as claimed in claim 1, wherein the light zone (2'''; 2'''') has a diameter of 16 mm or less.

5. The LED module (1) as claimed in claim 1, wherein the diffusing screen (4) is separated from the upper side of the light zone (2'''; 2'''') by a mixing chamber.

6. The LED module (1) as claimed claim 1, wherein the light zone (2'''; 2'''') with the planar sectors (3a''', 3a'''', 3b''', 3b'''', 3c''', 3c'''', 3d''', 3d'''') is produced by a dispensing method.

7. The LED module (1) as claimed in claim 1, wherein the planar sectors (3a''', 3a'''', 3b''', 3b'''', 3c''', 3c'''', 3d''', 3d'''') of the light zone (2'''; 2'''') are separated from one another by dams (5).

8. The LED module (1) as claimed in claim 7, wherein the dams (5) have a width which, when viewed in plan view, is between 50 μm and 2 mm, or between 100 μm and 1 μm or between 300 μm and 800 μm.

9. The LED module (1) as claimed in claim 7, wherein the dams (5) are reflective, with a reflecting, white or metallized surface.

10. The LED module (1) as claimed in claim 1, wherein the planar sectors (3a''', 3a'''', 3b''', 3b'''', 3c''', 3c'''', 3d''', 3d'''') of the light zone (2'''; 2'''') comprise a transparent potting compound or a potting compound containing a phosphor, the phosphor being inorganic phosphor or a Q dot, and the potting compound being a silicone-based potting compound.

11. The LED module as claimed in claim 1, wherein the planar sectors (3a''', 3a'''', 3b''', 3b'''', 3c''', 3c'''', 3d''', 3d'''') being designed at least for emitting light from the blue light spectrum or light from a different light spectrum produced by a phosphor.

12. The LED module as claimed in claim 1, wherein the planar sectors (3a''', 3a'''', 3b''', 3b'''', 3c''', 3c'''', 3d''', 3d'''') are respectively provided with at least one LED or at least one string of LEDs (6a''', 6b'''').

13. The LED module (1) as claimed in claim 1, wherein light with at least 2 different light spectra is emitted by the planar sectors (3a''', 3a'''', 3b''', 3b'''', 3c''', 3c'''', 3d''', 3d''').

14. The LED module (1) as claimed in claim 13, wherein one of the light spectra exhibits a peak in the range of 520-580 nm.

15. The LED module (1) as claimed in claim 13, wherein one of the light spectra exhibits a peak in the range of 520-580 nm and another in the range of 580-650 nm.

16. The LED module (1) as claimed in claim 1, wherein white light with at least two different color temperatures is emitted by the planar sectors.

17. The LED module (1) as claimed in claim 16, wherein a first color temperature is in the range of 2700-6500 K and a second color temperature is in the range of 6500-10000 K.

18. The LED module (1) as claimed in claim 1, wherein adjacent sectors of the circular ring (3a''', 3b'''; 3a'''', 3b'''') in the radial direction and circumferential direction have varying potentials.

19. A lamp device comprising at least one LED module (1) as claimed in claim 1, and a reflector placed onto the LED module (1).

20. A light emitting diode (LED) module (1) for emitting mixed light comprising:
- a light zone (2'''; 2''''), which is divided into multiple planar sectors for emitting different light spectra, and
- a light-diffusing screen (4), which is arranged at a distance from the light zone (2'''; 2'''') in the light-emitting direction of the light zone (2'''; 2''''), wherein white light with at least two different color temperatures is emitted by the planar sectors, and
- the planar sectors of the light zone (2''') comprising sectors of a circular ring (3a''', 3b'''; 3a'''', 3b''''),
- the planar sectors of the light zone (2''') each include an individual voltage-carrying line such that the planar sectors of the light zone (2''') are individually driven,
- wherein the planar sectors of the light zone (2''') include strings of LEDs, and the string of LEDs have varying voltage potentials,
- each voltage-carrying line is positioned in a transitional region between adjacent planar sectors of the planar sectors of the light zone (2'''), and
- each voltage-carrying line extends in a radial direction to separate adjacent sectors of the circular ring (3a''', 3b'''; 3a'''', 3b'''').

21. The LED module as claimed in claim 20, wherein the planar sectors (3a''', 3a'''', 3b''', 3b'''', 3c''', 3c'''', 3d''', 3d'''') of the light zone (2'''; 2'''') are separated from one another by dams (5).

22. The LED module as claimed in claim 20, wherein the light zone has differing color temperatures including a warm white and a cold white.

23. The LED module as claimed in claim 20, wherein the planar sectors (3a''', 3a'''', 3b''', 3b'''', 3c''', 3c'''', 3d''', 3d'''') are adapted at least for emitting light from the blue light spectrum of at least one LED chip of the sector and light from a further light spectrum produced by a phosphor.

24. A method for producing a light emitting diode (LED) module (1) for emitting mixed light which comprises the following steps:
- producing a light zone (2'''; 2''''), which is divided into planar sectors (3a''', 3a'''', 3b''', 3b'''', 3c''', 3c'''', 3d''', 3d''''),
- arranging a light-diffusing screen (4) at a distance from the light zone (2'''; 2'''') in the light-emitting direction of the light zone (2'''; 2''''), the planar sectors of the light zone (2'''; 2'''') being formed as sectors of a circle (3c''', 3d'''; 3c'''', 3d'''') and sectors of a circular ring (3a''', 3b'''; 3a'''', 3b''''), by
  - forming dams (5), which separate the planar sectors (3a''', 3a'''', 3b''', 3b'''', 3c''', 3c'''', 3d''', 3d'''') of the light zone (2'''; 2'''') from one another; and
  - filling in between the dams (5) of each sector (3a''', 3a'''', 3b''', 3b'''', 3c''', 3c'''', 3d''', 3d'''') a transparent potting compound or a potting compound containing a phosphor, and
- providing a voltage-carrying line for each planar sector of the planar sectors of the light zone (2''') such that the planar sectors of the light zone (2''') are individually driven,
- wherein the planar sectors of the light zone (2''') include strings of LEDs, and the string of LEDs have varying voltage potentials,
- each voltage-carrying line is positioned in a transitional region between adjacent planar sectors of the planar sectors of the light zone (2'''), and
- each voltage-carrying line extends in a radial direction to separate adjacent sectors of the circular ring (3a''', 3b'''; 3a'''', 3b'''').

25. The method for producing a LED module (1) as claimed in claim 24, wherein the filling of the potting compound is carried out by a dispensing method.

* * * * *